US006409904B1

(12) United States Patent
Uzoh et al.

(10) Patent No.: US 6,409,904 B1
(45) Date of Patent: *Jun. 25, 2002

(54) METHOD AND APPARATUS FOR DEPOSITING AND CONTROLLING THE TEXTURE OF A THIN FILM

(75) Inventors: Cyprian Emeka Uzoh, Milpitas; Homayoun Talieh, San Jose, both of CA (US)

(73) Assignee: Nutool, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/373,681

(22) Filed: Aug. 13, 1999

Related U.S. Application Data

(63) Continuation-in-part of application No. 09/201,929, filed on Dec. 1, 1998, now Pat. No. 6,176,992, which is a continuation-in-part of application No. 09/285,621, filed on Apr. 3, 1999, now Pat. No. 6,328,872.

(51) Int. Cl.$^7$ .............................. C25D 5/52; C25D 5/50; C25D 5/00
(52) U.S. Cl. ..................... 205/137; 205/224; 205/222
(58) Field of Search ................ 205/222, 224, 205/137, 87

(56) References Cited

U.S. PATENT DOCUMENTS

| 3,395,092 A | 7/1968 | Ribes ........................ 204/212 |
| 3,436,259 A | 4/1969 | Regh et al. ................. 117/227 |

(List continued on next page.)

FOREIGN PATENT DOCUMENTS

| DE | 2008664 | 9/1971 |
| DE | 38 40 310 A | 7/1989 |
| DE | 4324330 | 3/1994 |
| EP | 0903774 A2 | 3/1999 |
| EP | 0960693 A2 | 12/1999 |
| WO | WO95/00295 | 1/1995 |
| WO | WO 97/13009 A | 4/1997 |
| WO | WO 99/25004 | 5/1999 |

OTHER PUBLICATIONS

J.M. Steigerwald, et al., "Pattern Geometry Effects in the Chemical–Mechanical Polishing of Inlaid Copper Structures", Oct. 1994, pp. 2842–2848.
Alan C. West, et al., "Pulse Reverse Copper Electrodeposition in High Aspect Ration Trenches and Vias", Sep. 1998, pp. 3070–3073.
Robert C. Contolini, et al., "Electrochemical Planarization for Multilevel Metallization", Sep. 1994, pp. 2503–2510.
C. Madore, et al., "Blocking Inhibitors in Catholic Leveling", I. "Theoretical Analysis", Dec. 1996, pp. 3927–3942.
M. Rubinstein, "Tampongalvanisieren in der Praxis, Teil 1." *Galvanotechnik*, vol.79, No.10, 1988, pp. 3263–3270 no month available.

*Primary Examiner*—Edna Wong
(74) *Attorney, Agent, or Firm*—Pillsbury Winthrop LLP

(57) ABSTRACT

The present invention provides a method and apparatus for plating a conductive material to a substrate and also modifying the physical properties of a conductive film while the substrate is being plated. The present invention further provides a method and apparatus that plates a conductive material on a workpiece surface in a "proximity" plating manner while a pad type material or other fixed feature is making contact with the workpiece surface in a "cold worked" manner. In this manner, energy stored in the cold worked regions of the plated layer is used to accelerate and enhance micro-structural recovery and growth. Thus, large grain size is obtained in the plated material at a lower annealing temperature and a shorter annealing time.

30 Claims, 11 Drawing Sheets

U.S. PATENT DOCUMENTS

| | | |
|---|---|---|
| 3,890,746 A | 6/1975 | Saegusa et al. ................ 51/334 |
| 3,922,207 A | 11/1975 | Lowrey, Jr. et al. .......... 204/16 |
| 3,959,089 A | 5/1976 | Watts .......................... 204/26 |
| 4,610,772 A | 9/1986 | Palnik ........................ 204/206 |
| 5,024,735 A | 6/1991 | Kadija ......................... 204/15 |
| 5,171,412 A | 12/1992 | Talieh et al. ................ 204/192 |
| 5,272,111 A | 12/1993 | Kosaki ....................... 437/192 |
| 5,429,733 A | 7/1995 | Ishida ........................ 204/234 |
| 5,558,568 A | 9/1996 | Talieh et al. ................ 451/303 |
| 5,650,039 A | 7/1997 | Talieh ....................... 156/636 |
| 5,692,947 A | 12/1997 | Talieh et al. .................. 451/41 |
| 5,755,859 A | 5/1998 | Brusic et al. .............. 106/1.22 |
| 5,807,165 A | 9/1998 | Uzoh et al. .................... 451/41 |
| 5,833,820 A | 11/1998 | Dubin ........................ 204/212 |
| 5,863,412 A | 1/1999 | Ichinose et al. ............ 205/652 |
| 5,930,669 A | 7/1999 | Uzoh ......................... 438/627 |
| 5,933,753 A | 8/1999 | Simon et al. ............... 438/629 |
| 6,004,880 A * | 12/1999 | Liu et al. .................... 438/692 |
| 6,176,992 B1 * | 1/2001 | Talieh ......................... 205/87 |

\* cited by examiner

METHOD AND APPARATUS FOR DEPOSITING AND CONTROLLING THE TEXTURE OF A THIN FILM

This is a continuation in part application of Ser. No. 09/201,929, filed Dec. 1, 1998, now U.S. Pat. No. 6,176,992, and Ser. No. 09/285,621, filed Apr. 3, 1999 now U.S. Pat. No. 6,328,872.

FIELD OF THE INVENTION

The present invention relates to a method and apparatus for plating a conductive material on a substrate. More particularly, the present invention is directed to a method and apparatus for depositing and altering the texture and electrical properties of the conductive material deposited on a semiconductor device, packaging substrate, or magnetic device/display.

BACKGROUND OF THE INVENTION

A particular process step in the manufacturing of integrated circuits, devices, and packages involves plating a semiconductor wafer or workpiece (e.g., flat panel, magnetic recording heads, packages, etc.) surface with a conductive material. Plating the wafer or workpiece surface with the conductive material has important and broad application in the semiconductor industry.

FIG. 1 illustrates a cross sectional view of a substrate with topographical features having various layers disposed thereon. For example, this figure illustrates a substrate 2 with or without devices (i.e., transistors, etc.) having deposited thereon a barrier or adhesive layer 4 and a seed layer 6. The top surface of the substrate 2 may be patterned with vias, trenches, holes, and other features, or it may be flat. The barrier layer 4 may be tantalum (Ta), nitrides of tantalum (Ta), titanium (Ti), tungsten, TiW, CuWP, CoWP or combinations of any other material that is commonly used in this field. The barrier layer 4 is generally deposited on the substrate 2 by any of the various sputtering methods, by chemical vapor deposition (CVD), or by electrolyte/electroless plating methods. Thereafter, the seed layer 6 is deposited over the barrier layer 4.

The barrier layer 4 and the seed layer 6 may also be formed on the substrate 2 by using an electro-deposition method. This method offers distinct and unique advantages of lower costs and beneficial material properties (i.e., low stress in the substrate 2) as opposed to using other deposition methods.

The seed layer 6 material may be copper or copper substitutes. The seed layer 6 may be deposited on the barrier layer 4 using various sputtering methods, CVD, or electroless deposition or combinations thereof The seed layer 6 thickness, depending on the substrate 2 topography, may vary from 20 to 1500 Å°, and may be discontinuous on the corners of the deep recesses of the substrate 2. After depositing the seed layer 6, a conductive layer 8 (e.g., copper layer) is generally electroplated over the seed layer 6 from a suitable acid or non-acidic plating bath or bath formulation.

In general, the texture of a large portion of the conductive layer 8 is dependent upon the texture of an underneath layer, for example, the seed layer 6. Texture as defined in this application includes, but are not limited to, the crystal orientation (i.e., <111>, <110>), grain size, grain boundary (boundary around a single grain), etc. The texture of the remaining portion of the conductive layer 8 is dependent upon the chemicals in the plating bath and the deposition rate. In other words, if the crystal orientation of the seed layer 6 is formed predominantly in a <111> orientation, then a large portion of the conductive layer 8 will have the same crystal orientation, that being <111>. With that being said, the texture of the seed layer 6 is also dependent upon the texture of the barrier layer 4.

When the plated conductive layer 8 is formed on the seed layer 6, the conductive layer 8 may be epitaxial with the seed layer 6 up to a thickness of about 3000 Å° from the top surface of the seed layer 6. However, when the thickness of the conductive layer 8 is above 3000 Å°, the texture of the portion of the conductive layer 8 above 3000Å° may be dependent upon the nature of the plating bath.

After depositing the conductive layer 8, particularly when the conductive layer 8 is copper or gold, metallurgical grain recovery and grain growth generally occurs at room temperature. Thus, the grain size of the initially deposited conductive layer is typically about 30 to 100 Å°, but can increase in size in the range of 2,000 to 10,000 Å° after grain growth at room temperature. The final grain size of the conductive layer 8 is dependent on the seed layer 6 material, the chemistry of the plating bath, and annealing temperature.

The texture of the annealed grains in the conductive layer 8 is often very similar to the texture of the grains of the seed layer 6. Thus, it is very difficult to form grains in the conductive layer 8 that are different in their texture from the grains of the seed layer 6. In addition, it is also difficult to accelerate room temperature grain growth of the conductive layer 8 without changing the texture of the seed layer 6, bath chemistry and/or temperature.

Accordingly, there is a need for a method and apparatus that can disassociate the texture of a plated conductive layer from that of the underneath seed layer. There is also a need for a method and apparatus that accelerates room temperature grain recovery and grain growth. Further, there is a need for a method and apparatus that can form a highly desirable conductive layer while increasing the grain size in the conductive layer.

SUMMARY OF THE INVENTION

It is an object of the present invention to provide a method and apparatus that plates a conductive material on a workpiece surface in a highly desirable manner.

It is another object of the present invention to provide a method and apparatus that plates a conductive material on a workpiece surface without an anode, pad type material, or other fixed feature making direct contact with the workpiece surface.

It is a further object of the present invention to provide a method and apparatus that plates a conductive material on a workpiece surface while a pad type material or other fixed feature is intermittently making contact with the workpiece surface.

It is yet another object of the present invention to provide a method and apparatus that plates a conductive material on a workpiece surface while a pad type material or other fixed feature is intermittently making contact with the workpiece surface in a "cold worked" manner.

It is a further object of the present invention to provide a method and apparatus that plates a conductive material on a workpiece surface in a manner such that a pad type material or other fixed feature makes contact with the deposited material with sufficient force to "cold work" the deposited material.

It is yet a further object of the present invention to provide a method and apparatus that electro-deposits a conductive material on a workpiece surface to form a symmetrical/nonsymmetrical composite plated layers consisting of "non cold worked layers/regions" and "cold worked layers/regions."

In one preferred embodiment, the method according to the present invention includes the step of plating a conductive layer on the substrate using an anode/pad that rotates in a manner such that the plating solution is continuously applied onto the substrate without the anode/pad making contact with the substrate. Electrical power may be applied to the anode and the substrate during this plating process. After the conductive layer is formed on the substrate using the above stated method, the anode and the substrate may be momentarily de-energized, and the pad, which may or may not be rotating, is used to polish/rub against a top portion the conductive layer. Thus, the top portion of the conductive layer is polished during the "cold working" process (e.g., when the anode and substrate are de-energized). This process can be repeated at least several times depending upon the type of the integrated circuit or device to be manufactured. In this manner, the texture of the conductive layer is altered such that a highly desirable conductive layer is formed.

In one embodiment of the present invention, the apparatus that performs such plating includes a circular platen having a pad type material attached thereto. The platen further includes a circular anode plate, where both the platen and the anode plate can rotate about a first axis while the workpiece may also rotate, move side to side, move in an orbital manner, or remain stationary. Upon application of power to the anode plate and the cathode workpiece, the plating solution can be flowed to or through the pad to plate the workpiece surface.

In another embodiment of the present invention, an apparatus that performs such plating includes a pad type material mounted on the cylindrical anode that rotates about a first axis. The metal from the plating solution can be deposited on the workpiece when a potential difference is applied between the workpiece and the anode.

In both embodiments, the pad may make intermittent contact with the workpiece surface after the conductive layer is formed on the substrate. The pad may smear, shear, polish/rub a top portion of the conductive layer in a "cold worked" manner such that the texture of the top portion of the conductive layer is altered.

Further, the present invention provides a method of forming an insitu cold worked layer with the deposited material during the deposition process, or alternate forming cold worked and non-cold worked layers on the substrate. The present invention also provides a method and apparatus for controlling the texture of the deposited conductive layer from the seed layer, bath chemistry, and temperature.

In addition, energy stored in the cold worked regions or portions of the deposited layer is used to accelerate the grain recovery and growth. Thus, large grain size can be obtained in the deposited material at a lower annealing temperature and a shorter annealing time.

BRIEF DESCRIPTION OF THE DRAWINGS

These and other objects and advantages of the present invention will become apparent and more readily appreciated from the following detailed description of the presently preferred exemplary embodiment of the invention taken in conjunction with the accompanying drawings, of which.

DETAILED DESCRIPTION OF THE PREFERRED EMBODIMENTS

The preferred embodiments of the present invention will now be described with reference to FIGS. 2–11. The inventors of the present invention have found that by plating and intermittently rubbing/polishing or "cold working" the plated material and/or plating over the cold worked plated material, the texture of the plated material can be modified to disassociate it from the texture of the underneath layer. For example, intermittently rubbing or cold working the plated material changes the crystal orientation of the plated material from, for example <111> to a more random orientation.

Alternatively, the present invention can be used in the deposition of magnetic or magnetoresistive type films such as those used for magnetic or magnetoresistive sensor and applications. During magnetic film deposition, in a strong magnetic field, the workpiece is stationary, and only the anode rotates. Insitu cold working of the magnetic film such as permalloy during deposition may enhance the preferred orientation in the deposited film, thus greatly enhancing the desirable magnetic properties.

The present invention can be used with any semiconductor workpieces such as a flat panel, magnetic film head, or packaging substrate including lead-tin solder alloys, or lead free solderable alloys. Further, specific processing parameters such as time, temperature, pressure and the like are provided herein, which specific parameters are intended to be explanatory rather than limiting.

The present invention further describes a method and apparatus for intermittently applying the conductive material to the semiconductor substrate and also intermittently polishing the substrate when a pad type material or other fixed feature is making contact with the workpiece surface. When intermittently applying the conductive material, the present invention applies electrical current having a potential difference between the workpiece and an anode so that the conductive material can be deposited to the workpiece when such current is applied.

Figure 1:
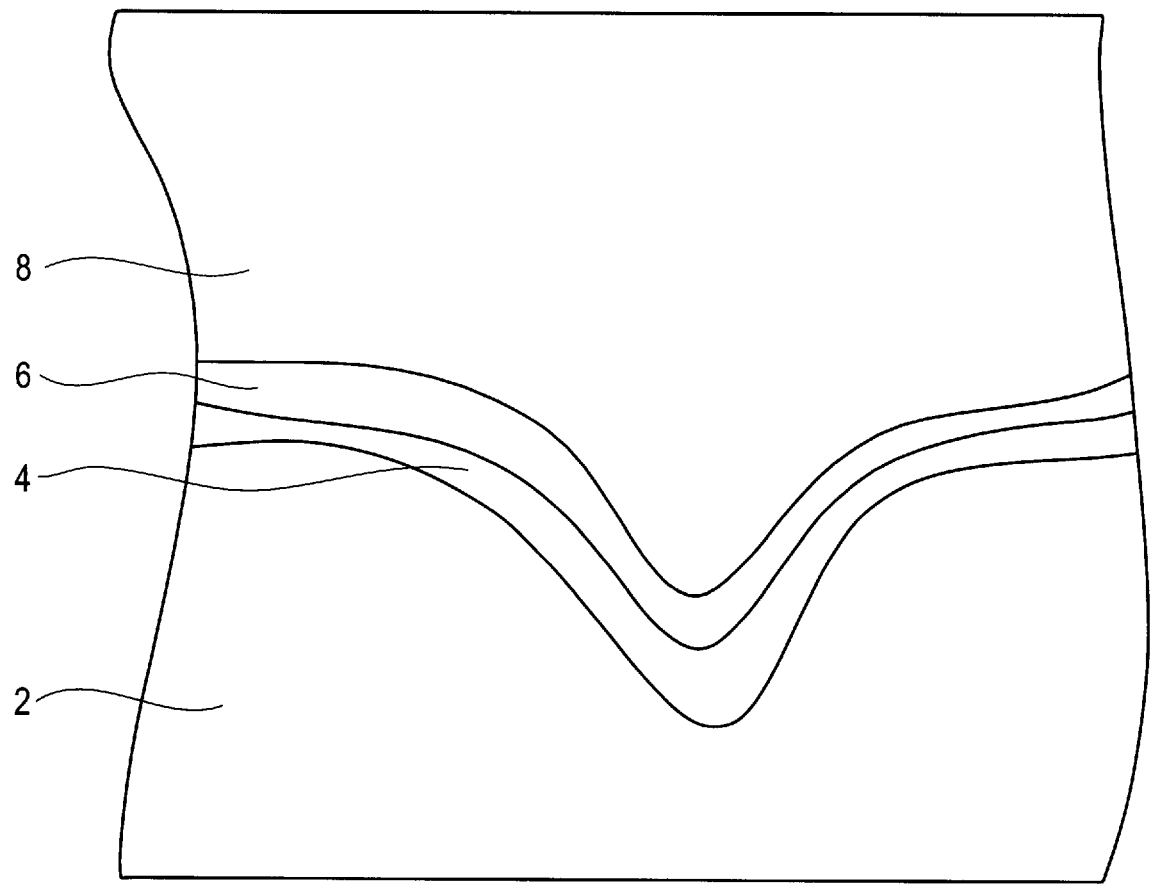
FIG. 1 illustrates a cross sectional view of a substrate having various layers disposed thereon.
Figure 2:
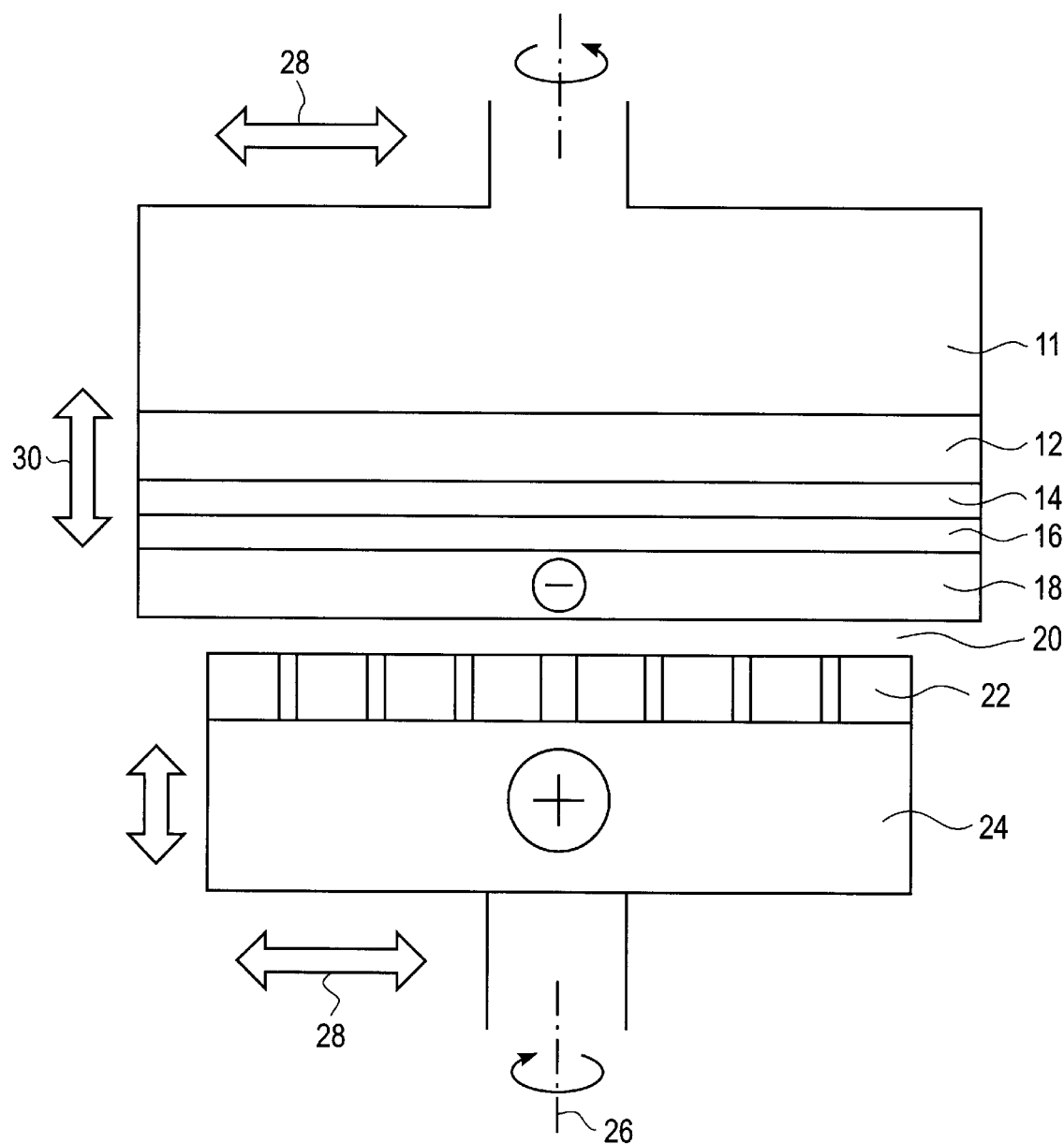
FIG. 2 illustrates an enlarged cross sectional view of a cathode workpiece and an anode having a pad in accordance with the preferred embodiment of the present invention.

FIG. 2 illustrates an enlarged cross sectional view of a cathode workpiece and an anode having a pad or similar non conductive surface in accordance with the present invention. The pad or non conductive surface allows an electric field to pass through, but prevents shorting between the anode and the cathode, as described in more detail later herein. A barrier layer 14 and a seed layer 16 are formed on a workpiece 12 using any known method. A first conductive layer 18 of, for example, copper is plated over the seed layer 16. Copper may be deposited on the seed layer 16 using a highly leveling or non-leveling bath at a current density that ranges from 3 to 70 MA/cm$^2$ but preferably the current density should be between 5 to 30 MA/cm$^2$.

A proximity plating method, as described in more detail later herein, can be used to form the copper layer 18 on the seed layer 16. An anode 24 having a pad (or a non conductive surface) 22 is used during the proximity plating method. In the preferred embodiment, the spacing or gap 20 between the conductive copper layer 18 and the pad 22 may range from less than 1 micron up to 2 millimeter. Preferably, the diameter or cross sectional length of the pad 22 and the workpiece 12 may range from about 5 millimeter to over 300 millimeter. The larger the workpiece, the larger the anode diameter. Thus, the length of the gap/spacing 20 between the pad and the workpiece 12 is very small as compared to the diameter or cross sectional length of the pad 22 and workpiece 12. The workpiece 12 and the anode 24 may be any suitable shape (e.g., circular, spherical, etc.).

A workpiece head assembly 11, as described in more detail later herein, is used to hold and position the workpiece 12. The workpiece head assembly 11 having the workpiece 12, and the anode 24 can rotate about their major axis 26 and move vertically as indicated by arrow 30. In the preferred embodiment, the rate of rotation for both the workpiece 12 and the anode 24 may range from 10 to 2000 rpm and may rotate at a different rate and direction from each other. In a different embodiment, during plating of magnetic film, the workpiece 12 may be stationary while only the anode 24 rotates. In the alternative, in some other applications, the workpiece 12 may rotate and/or move vertically while the anode 24 is stationary. Additionally, the anode 24 and the workpiece head assembly 11 may move laterally (side to side) in the direction indicated by arrow 28 during the deposition process. In other embodiments, the anode 24 and pad 22 may be much larger (i.e., 1.5 to 10 times larger in overall area than the workpiece 12) such that multiple workpieces 12 may be plated and polished simultaneously.

In operation during the deposition process, an electrolyte solution is flowed through or to the pad 22 at a rate between 0.05 to 4 gpm, but preferably between 0.1 to 3 gpm. Electrical power may be applied to the anode 24 and the workpiece 12 during this deposition process. In the preferred embodiment, copper may be deposited on the workpiece for 30 to 90 seconds at a suitable current density, after which the pad 22 is brought in contact with the conductive layer (copper) 18 for about 1 to 180 seconds, at a pressure that may range from 0.0001 to about 5 psi. When such contact is made, the conductive layer 18 is cold worked or scratched polished. Electro-deposition may continue during this insitu cold working process. The cathode (workpiece) and/or anode are momentary de-energized during this cold working process. After the cold working process, a layer of non-cold worked conductive layer may be deposited over the cold worked layer as described above. Thus, a sequence of steps such as electro-depositing/cold working/electro-depositing can be performed on the workpiece 12.

Figure 3A:
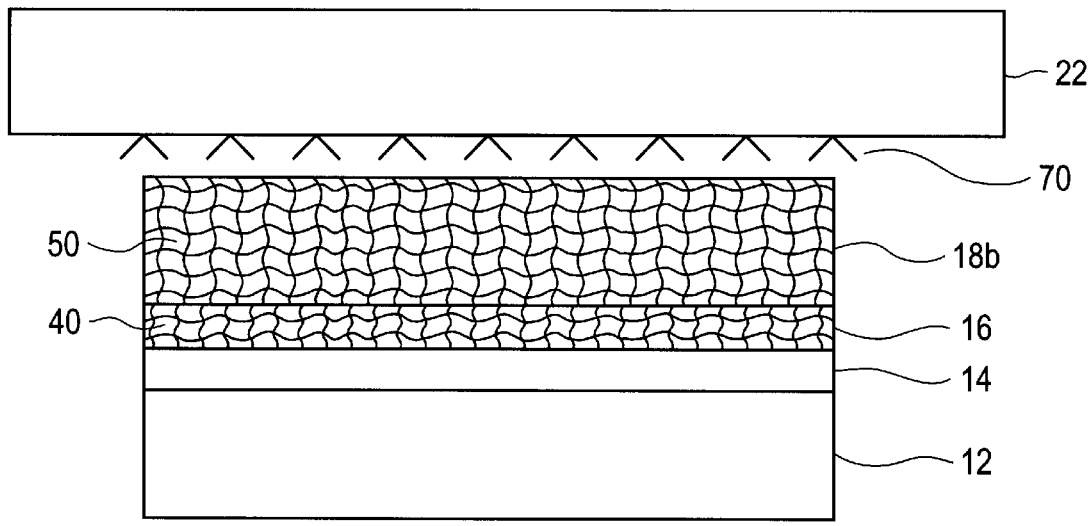
FIGS. 3A–3E illustrate cross sectional views of a method for forming a highly desirable conductive layer and advantageously affecting the texture of a conductive layer in accordance with the preferred embodiment of the present invention.

In further detail, FIGS. 3A–3E illustrate cross sectional views of a method for forming a highly desirable conductive layer on a workpiece in accordance with the preferred embodiment of the present invention. As illustrated in FIG. 3A, a barrier layer 14 and a seed layer 16 are disposed on a workpiece 12 using any method described above. As shown, the seed layer 16 is composed of individual grains 40, which are oriented in a predetermined order, such as a <111> crystal orientation. For a copper or gold seed layer, the grains 40 will generally be small, ranging between 20 to 200 Å° or higher depending on processing conditions.

A first conductive layer 18b is plated on the seed layer 16 using a proximity plating method, or other plating methods. The first conductive layer 18b will include grains 50, which will retain most of the crystal orientation of the seed layer 16. Accordingly, if the grains 40 in the seed layer 16 have a <111> crystal orientation, so will most of the grains 50 in the first conductive layer 18b. The size of the grains 40, 50 will also be very similar.

Figure 3B:
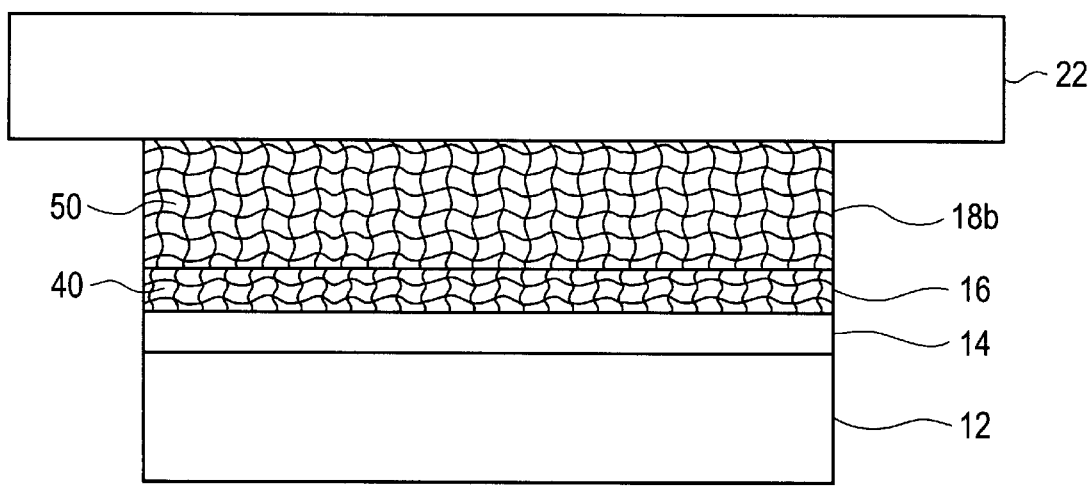

In FIG. 3B, after plating a first level of the conductive layer 18b on the seed layer 16, an abrasive surface, such as a pad 22, polishes/rubs/buffs the first conductive layer 18b and creates dangling bonds and may change the crystal orientation of the deposited material. As stated above, the pad polishes/rubs the first conductive layer 18b in a cold worked manner. It has been determined that the polishing action causes the grains in the top portion of the first conductive layer 18b (cold worked layer) to have a different texture than the underneath layer of the first conductive layer 18b.

Figure 3C:
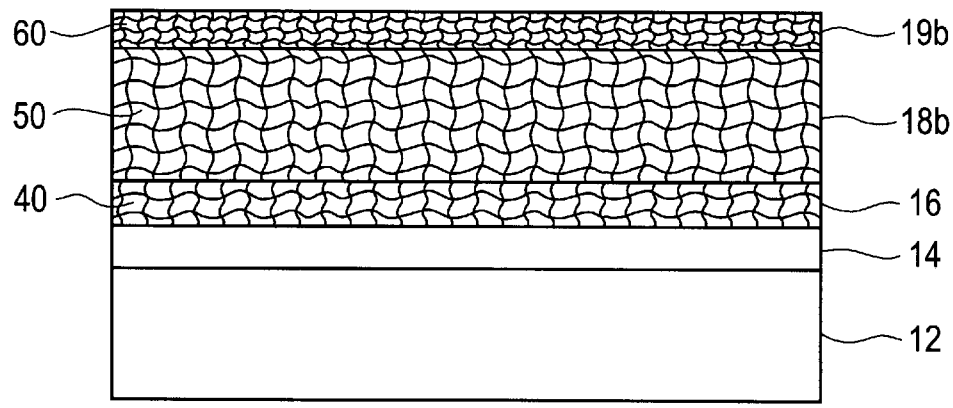

As described above, electro-deposition may continue during this insitu cold working process. FIG. 3C illustrates a cold worked layer 19b (top portion of the first conductive layer 18b). The texture of the material in the cold worked layer 19b will be significantly different from the texture of the rest of the first conductive layer 18b. This is illustrated in FIG. 3C as larger grains 50 are transformed into smaller grains 60 in the cold worked layer 18b. For a copper conductive layer, the smaller grains 60 range between 20 to 80 Å°.

Figure 3D:
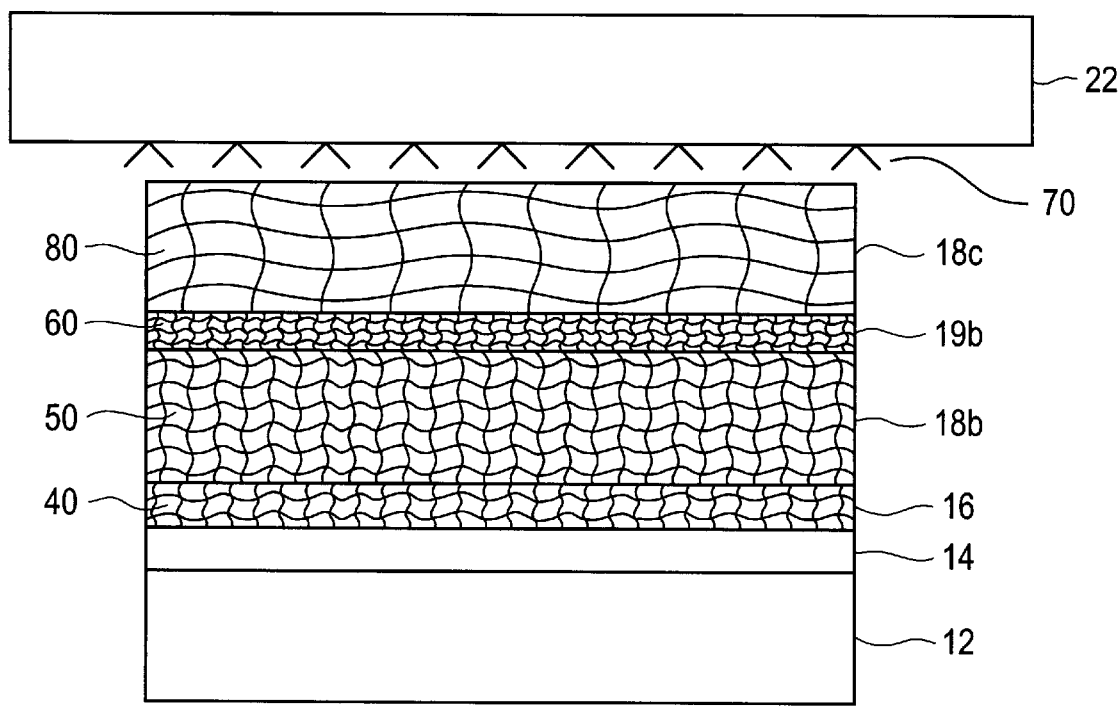

Next, in FIG. 3D, a second level conductive layer 18c is proximately plated over the first cold worked layer 19b using the pad 22. The texture of the second conductive layer 18c will be different from that of the first conductive layer 18b, even though both layers are deposited by the proximity plating method. Thus, the cold worked layer 19b is used to disassociate the texture of grains 80 of the second conductive layer 18c from that of the first conductive layer 18b.

Figure 3E:
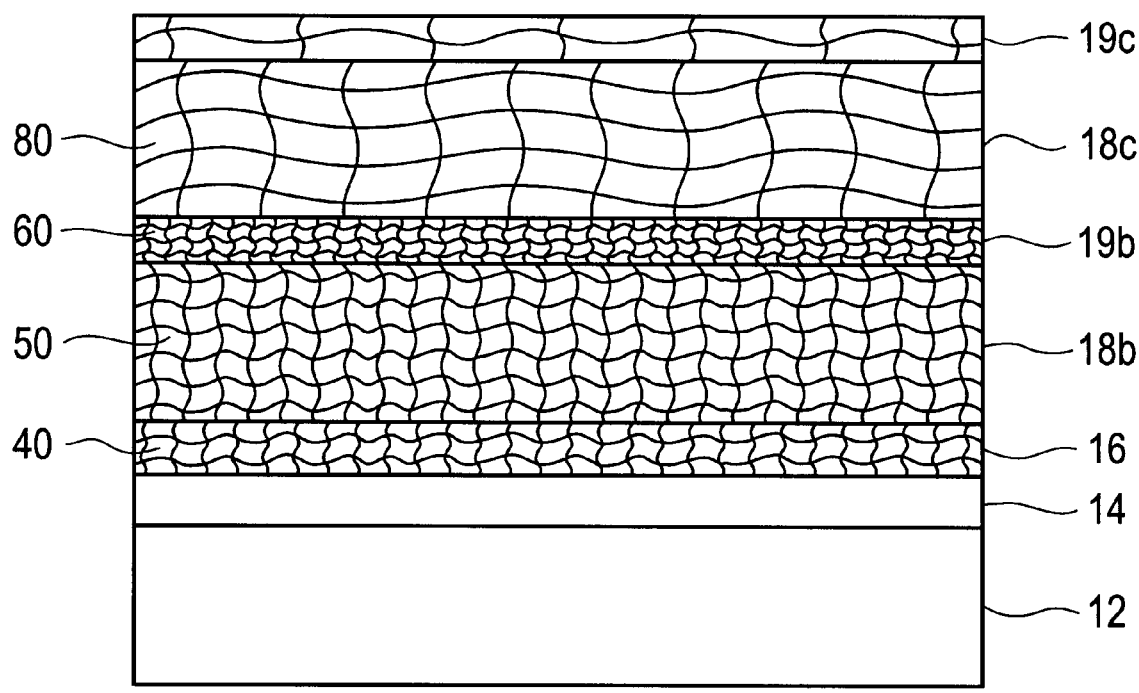

As the proximity plating and the cold worked polishing steps are repeated, this leads to a second level conductive layer 18c and second level cold worked layer 19c having a greater degree of randomness than the first level layers as shown in FIG. 3E.

Figure 4A:
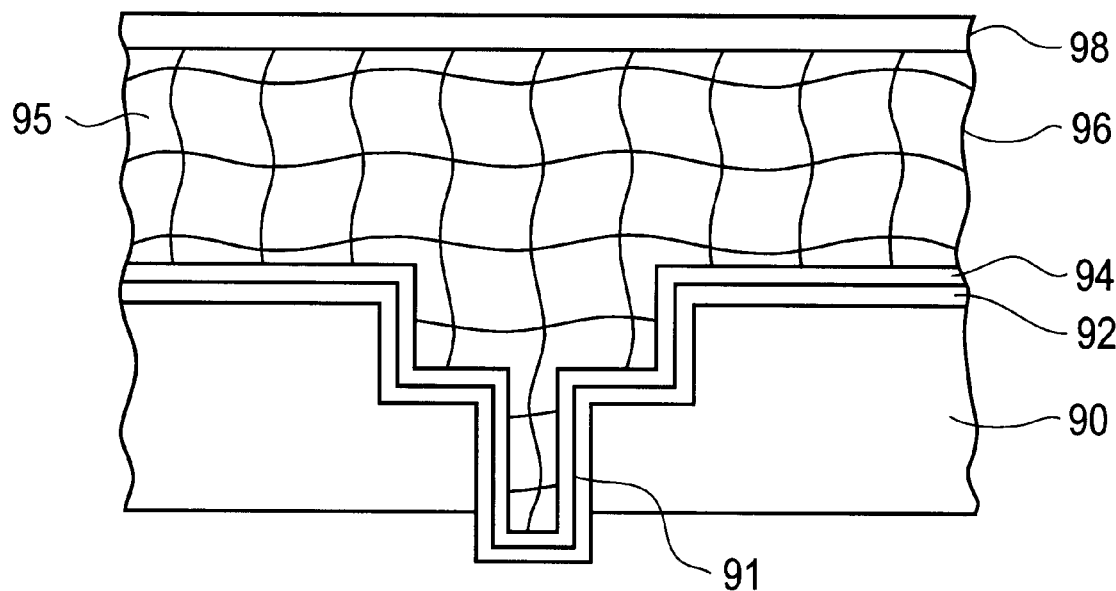
FIG. 4A illustrates a cross sectional view of a wiring structure having a cold worked layer in accordance with the preferred embodiment of the present invention.
Figure 4B:
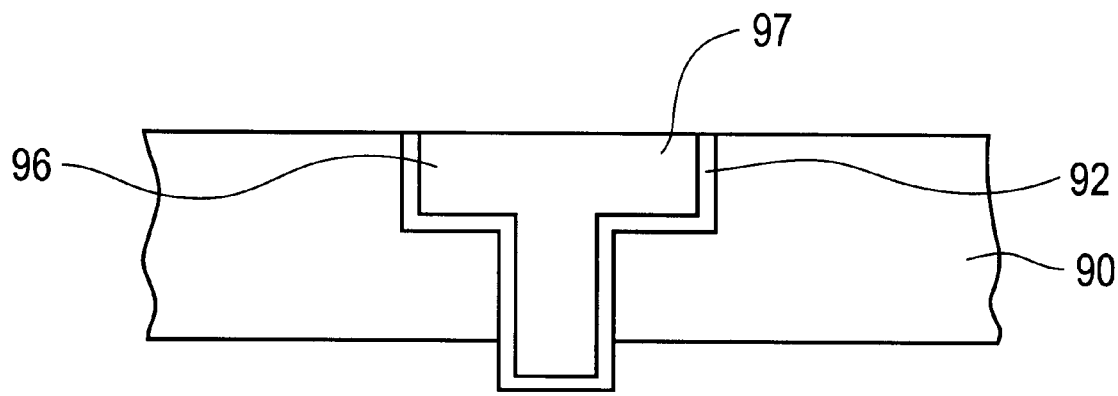
FIG. 4B illustrates a cross sectional view of a wiring structure after annealing and polishing a conductive layer in accordance with the preferred embodiment of the present invention.

FIG. 4A illustrates an enlarged view of a wiring structure having a cold worked layer and FIG. 4B illustrates an enlarged view of the same wiring structure of FIG. 4A after annealing and polishing the cold worked and conductive layers from the top surface of the substrate. In FIG. 4A, a trench 91 is formed in an insulating layer 90 using any conventional method. A barrier layer 92 and a seed layer 94 are then formed on the insulating layer 90 and trench 91. After a conductive layer 96 is plated on the seed layer 94, a cold worked layer 98 is formed, again using the method described earlier herein.

The energy stored in the cold worked layer 98 is used to accelerate the grain recovery and growth of the deposited conductive layer 96 during an annealing process. Thus, large grain size is obtained in the deposited material at a lower annealing temperature and for a shorter annealing time, as defined below.

FIG. 4B illustrates the wiring structure after the substrate has been annealed and polished. After cold working the conductive layer 96, the substrate (workpiece) can be annealed preferably at a temperature between 50 to 400° C. for a period of 15 seconds to 60 minutes. The annealing process can transform the smaller grains 95 to a larger grain 97, or a single crystal via and line, as illustrated in FIG. 4B. The size of the larger grain 97 formed in the conductive layer 96 (copper or gold) is preferably between 1 to 100 microns or larger, as compared to 0.5 to 2 um without using the cold working process.

In a given area of the conductive layer, it is often more desirable to have fewer larger grains than having smaller grains. The reason for this is because there will be less grain boundaries in an area having fewer larger grains than in an area having more smaller grains. As a result, fatigue and corrosion resistance within the grains is improved.

Using the methods and apparatus disclosed in the present and parent applications (e.g., Ser. Nos. 09/201,929 and 09/285,261), the inventors have recognized these textual advantages in the conductive layer described herein. These textual advantages allow a more desirable conductive layer to be formed on the substrate.

The polishing step may then be performed using CMP or any other conventional method. The inventors of the present invention have determined that polishing the substrate is more efficient and effective after cold working and annealing the substrate. The seed layer 94 that is shown in FIG. 4A is formed as part of the grain 97 because of the annealing temperature. The larger grain (crystal) 97 in the conductive layer 96 provides better electro migration, corrosion resistance, and longer fatigue life than a conductive layer having smaller grains 95 formed as a result of not using the cold working process. The conductive material having the larger grain 97 forms a single crystal via-line/line-via in the substrate. Thus, the cold worked layer 98 can be considered a sacrificial layer in the substrate because it is used primarily to modify the texture of the conductive layer for better performance.

Figure 5:
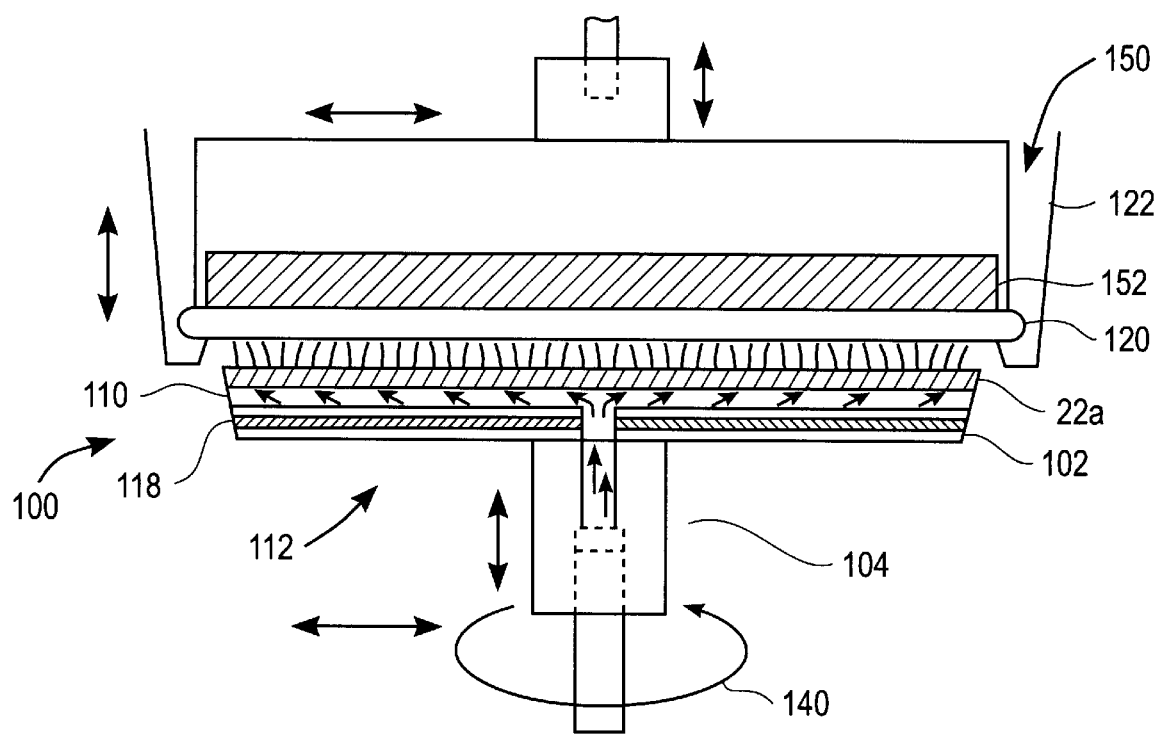
FIG. 5 illustrates a side view of an apparatus in accordance with the first preferred embodiment of the present invention.

FIG. 5 illustrates a side view of an apparatus in a first preferred embodiment of the present invention. The apparatus 100 includes a rotatable platen 102 fixed to a rotatable shaft 104, a pad 22a mounted on the platen 102, and a workpiece head assembly 150 arranged in proximity to the platen 102. The rotatable platen 102 and/or pad 22a may be circular, pear-shaped, or form in any other shape so long as they can effectively and efficiently plate and cold work the workpiece. The head assembly 150 and/or the platen 102 are adapted to move up and down when a suitable force is exerted. The force is generated, for example, by mechanical, electromechanical and/or pneumatic means as known in the art. A plating solution is preferably flowed through the platen 102 and the pad 22a via channel 110. As the shaft 104 rotates in the direction 140, the plating solution is splashed or applied via pad 22a onto the workpiece 120 while the cathode/anode electrodes are energized. As describe above, a conductive layer is thus formed on the workpiece 120. Preferably, the distance between the workpiece 120 and the pad 22a is less than 1 micron up to 2 millimeters.

In order for the plating solution to form a conductive layer on the workpiece 120, an electrical potential is applied to the workpiece 120 via contacts 122. Meanwhile, a circular anode plate or similar plate type object 118 in the platen 102 is used such that an electric potential is applied thereto. When there is a potential difference between the cathode workpiece 120 and the platen 102, the plating solution that is flowed via pad 22a forms a closed circuit. Thus, this allows for a more uniform, high quality layer to be formed on the surface of the workpiece 120.

After forming such a conductive layer, either the head assembly 150 is lowered and/or the plating apparatus 112 is raised such that the pad type object 22a makes contact with the workpiece 120 in a cold worked manner. When such contact is made, the orientation of the various atomic plane in the conductive layer is disoriented/modified. Then, the workpiece head assembly 150 and the plating apparatus 112 are spaced apart so that a second conductive layer may be formed on the workpiece surface. This process is repeated until a desirable layer is formed.

The workpiece head assembly 150 may include a nonconductive, preferably circular, chuck 152 with a cavity that is preferably a few millimeters deep at its center and which cavity may contain a resting suction pad (not shown). The workpiece 120 is loaded into the cavity, backside first, against the resting suction pad using a conventional type of transport or vacuum mechanism to ensure that the workpiece 120 is stationary with respect to the head assembly 150 while in use. A nonconductive retaining ring (not shown) such as an O-ring or other rubber type of seal at the periphery of the head assembly 150 and a cathode contact electrode 122 each push against the edge of the workpiece 120 and hold it in place. The entire back side of the workpiece 120 which pushes against the chuck 152 that is under the retaining ring is thus protected from any and all solutions, including electrolyte. Other conventional workpiece head assemblies can be used in accordance with the present invention.

Instead of using the cathode contacts 122 described above, the electric potential can be applied to the wafer using a ring conductor. Further, other methods of applying the electric potential to the wafer may be used in accordance with the present invention. For example, a liquid conductor or an inflatable tube coated with a conductive material may be used in the present invention. An example of using the liquid conductor or the conductive tube to provide the necessary electric potential according to the present invention is disclosed in the co-pending U.S. application Ser. No. 09/283,024, filed Mar. 30, 1999, now U.S. Pat. No. 6,251,235, entitled "Method And Apparatus For Forming an Electric Contact With a Semiconductor Substrate", commonly owned by the assignee of the present invention.

Any known method for providing the electric potentials to the anode 118 and cathode workpiece 120 can be used in the present invention. As is known in the art, the difference in the electric potential applied to the anode 118 and workpiece 120 results in the workpiece surface being plated.

Figure 6:
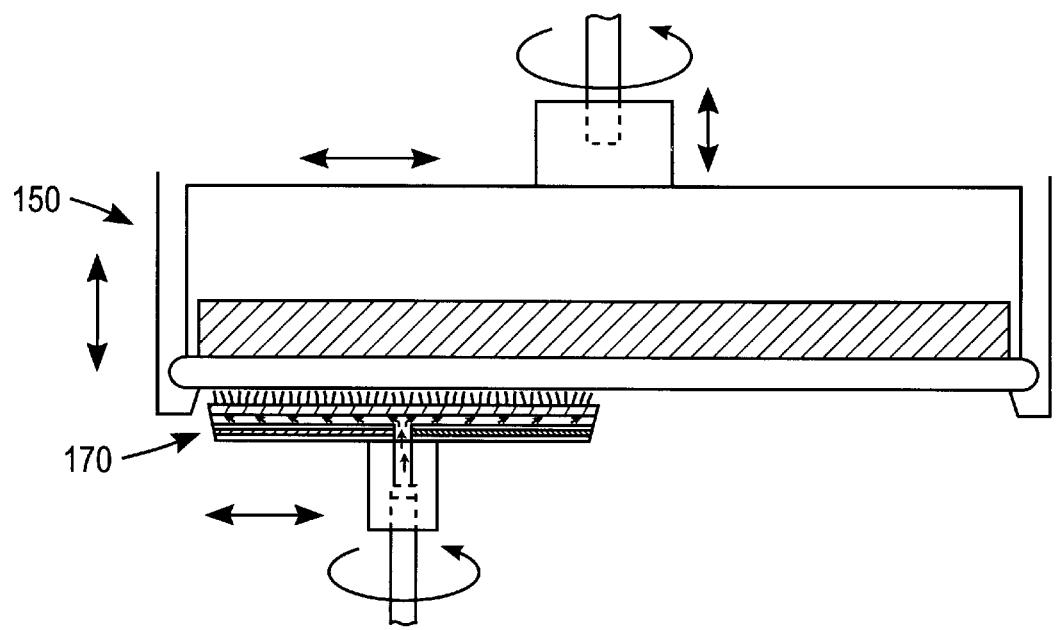
FIG. 6 illustrates a side view of an apparatus in accordance with the second preferred embodiment of the present invention.

FIG. 6 illustrates a second preferred embodiment of the apparatus in accordance with the present invention. The workpiece head assembly 150 may be the same as that described with reference to FIG. 5. As illustrated, a plating apparatus 170 is considerably smaller than the plating apparatus 112 of FIG. 5, but the features and functionality of the two plating apparatus 112, 170 are similar. The surface of the pad that is attached to the plating apparatus 170 is about 30 to 60%, or preferably 45 to 55%, of the workpiece surface. In the preferred embodiment, during operation, the plating apparatus 170 may rotate at a rate from 40 to 500 rpm and the workpiece head assembly 150 may rotate at a rate between 30 to 1000 rpm. The plating apparatus 170 may also move laterally (side to side) in order to plate/cold work the entire workpiece via, for example, rollers (not shown).

Figure 7:
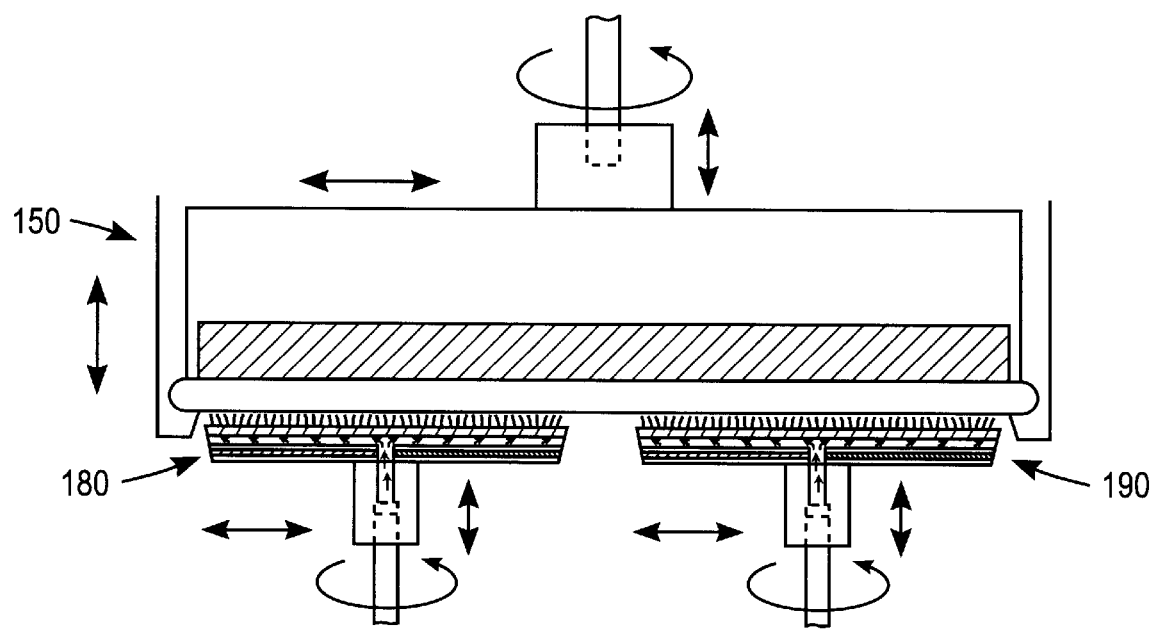
FIG. 7 illustrates a side view of an apparatus in accordance with the third preferred embodiment of the present invention.

FIG. 7 illustrates a third preferred embodiment in accordance with the present invention. As shown, two plating apparatus 180 and 190 (similar to the apparatus 170) may be used to plate/cold work the workpiece. In other embodiments, more than two plating apparatus may be used simultaneously to plate/cold work the workpiece.

Figure 8:
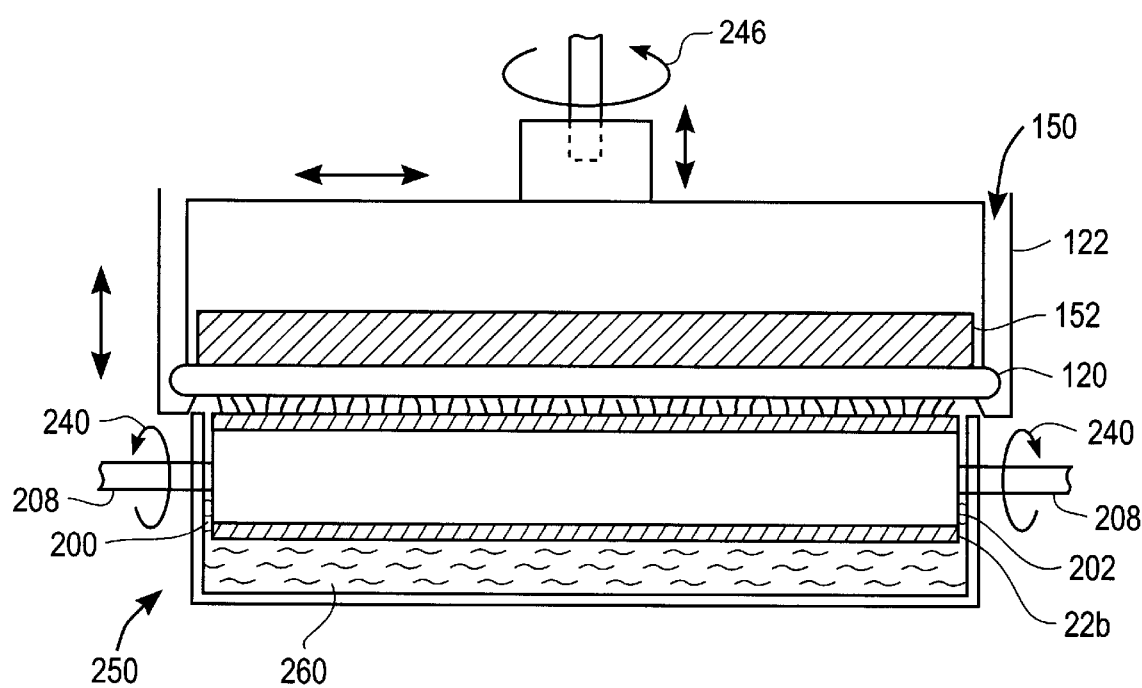
FIG. 8 illustrates a side view of an apparatus in accordance with the fourth preferred embodiment of the present invention.

FIG. 8 illustrates a fourth embodiment of the apparatus in accordance with the present invention. The anode assembly 200 having a pad 22b mounted on a cylindrical anode 202 may rotate about a first axis 240, and a workpiece head assembly 150 having a workpiece 120 may rotate about another axis 246. The head assembly 150 is similar to that described above with respect to the first embodiment of the present invention. The cylindrical anode 202 is connected to shafts 208 for rotating about axis 240. Although shown as operating upon a single workpiece, it is understood that a plurality of head assemblies 150 can be used with the present invention. The anode assembly 200 is positioned within a chamber 250 that may include a plating solution 260.

In operation according to the fourth preferred embodiment of the invention, the apparatus applies, using a power source, a negative potential to the cathode contact 122 and a positive potential to the anode 202. When an electric current is established between the two electrodes, metal in the plating solution 260 is deposited on the surface of the workpiece 120 while the cylindrical anode rotates about axis 240 similar to that described above with reference to FIG. 5. After forming the conductive layer, the head assembly is preferably lowered such that the workpiece 120 can be "cold worked" with the pad 22b. The plating and "cold worked" steps are repeated until a desirable layer is formed on the workpiece.

Figure 9:
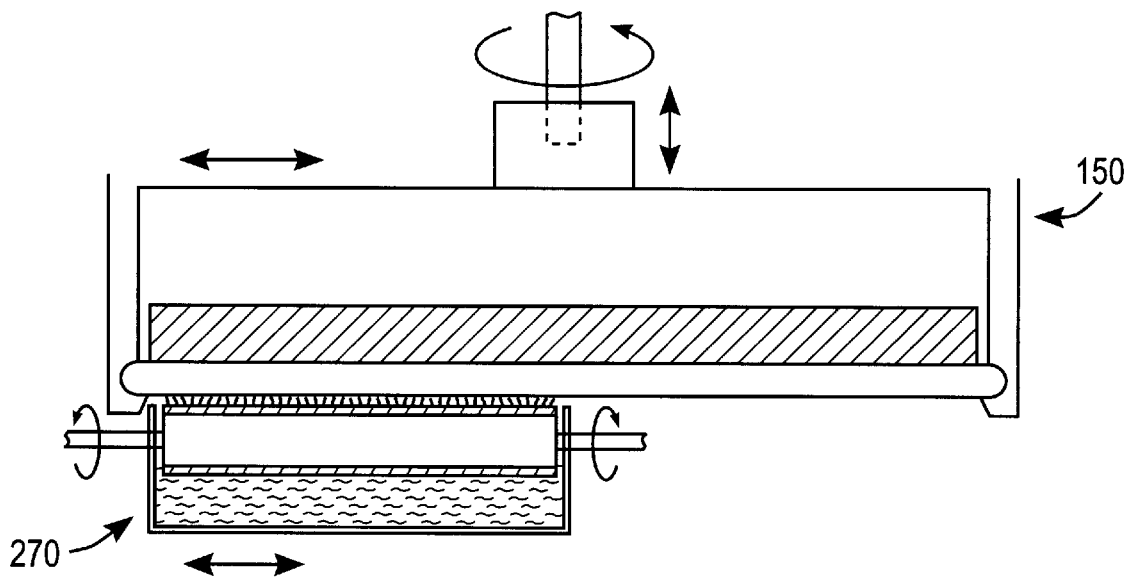
FIG. 9 illustrates a side view of an apparatus in accordance with the fifth preferred embodiment of the present invention.

FIG. 9 illustrates a fifth preferred embodiment of the apparatus in accordance with the present invention. The workpiece head assembly 150 may be the same as that described with reference to FIGS. 5–8. As illustrated, a plating chamber 270 is considerably smaller than the plating chamber 250 of FIG. 8, but the features and functionality of the two chambers 250, 270 are similar. In the preferred embodiment, the surface of the pad that is attached to the cylindrical anode in the plating chamber 270 is about 30 to 60%, or preferably 45 to 55%, of the workpiece surface. During operation, the cylindrical anode in the plating chamber 270 may rotate preferably at a rate from 40 to 500 rpm and the workpiece head assembly 150 may rotate at a rate between 50 to 1000 rpm. The plating chamber 270 may also move laterally (side to side) in order to plate/cold work the entire workpiece via, for example, rollers (not shown).

Figure 10:
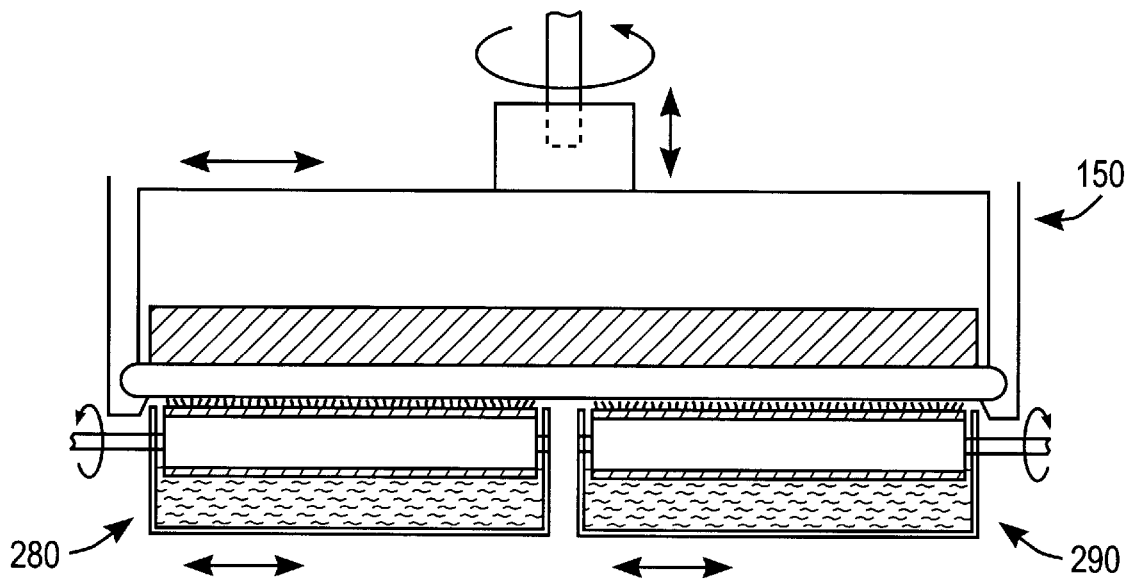
FIG. 10 illustrates a side view of an apparatus in accordance with the sixth preferred embodiment of the present invention.

FIG. 10 illustrates a sixth preferred embodiment in accordance with the present invention. As shown, two plating chambers 280 and 290 (similar to the plating chamber 270) having cylindrical anodes and pads attached thereto may be used to plate/cold work the workpiece. In other embodiments, more than two plating chambers and/or cylindrical anodes and pads may be used simultaneously to plate/cold work the workpiece.

In FIGS. 5–10, the plating solution can be introduced to the pad 22a, 22b from a reservoir (not shown) located in proximity to the anodes. In one specific embodiment, the anodes can have an in-channel that includes passageways within the center of anodes and holes that are made in the anode which together provide a path for the solution to be fed to the gap between the anode and the cathode. Alternatively, the plating solution can be dispensed directly onto the pad 22a, 22b through another channel in accordance with the methods described earlier herein.

The pad 22, 22a, 22b is preferably made of a nonconductive, hard, porous or perforated type material such as polyurethane. An example of such pad is the IC 1000 pad manufactured by Rodel, Inc. Also, the pad 22, 22a, 22b preferably has a circular shape, but may be shaped in any other form so long as it can effectively plate and/or cold work the workpiece. In the embodiments described herein, the hardness of the pad 22, 22a, 22b or fixed fixture is coupled with the relative speed of travel of the pad to the workpiece. In other words, depending on the speed of rotation of the pad and/or the workpiece, the particular pad may be selected with a certain level of hardness. For example, the pad material may be metallic, which is then separated from the anode by a porous insulating layer.

The pad 22, 22a, 22b may also contain fixed abrasives, which may be embedded in or are components of the pad 22, 22a, 22b. The particle size of the abrasives may range from 50 Å° to 50,000 Å°, but preferably is within 50 Å° to 2000 Å°. Also, the standard deviation of the particle size should be fairly low, preferably less than 5% of the mean size of the particles.

The abrasive material may, for example, consist of silica, silicon carbide, boron carbide, carbide particulate, alumina, cerium oxide, zirconia, titanium oxide, diamond, powders, nitride particles (boron nitrides, silicon nitrides, tantalum nitrides, titanium nitrides, and the like) or other various hard particles or their various combinations. The choice of abrasive and pad materials or their combination should be such that the abrasives or the pad material are sparingly soluble, preferably insoluble in the electrolyte solution being used.

It is also desirable to have the abrasive particles uniformly dispersed within a matrix/binder on the pad 22, 22a, 22b. The particle contact loading within the pad matrix may range from 5% to 75%, depending on the nature of the matrix material. The matrix material in the pad is preferably a polymeric material, such as acid resistant polymers, polyurethanes, highly cross-linked epoxies, highly fluorinated elastomers, and other suitable materials. Also, the pad matrix material may also be a metallic. In the case of a metallic material, to prevent electrically shorting the workpiece and the anode, it is imperative that a thin porous insulating material isolates the anode from the electrically conductive pad material. In the absence of an insulating porous film layer between the anode and the conducting pad material, it is imperative that the anode and the cathode be de-energized during the periods when the workpiece and the anode make contacts (i.e., during polishing or cold working). Also, the pad material may be a porous or perforated thin sheet of acid resistant amorphous material, glass, ceramic, or glass-ceramic material. For example, depending on the nature of the electrolyte solution, perforated thin sheet of alumina or silicon carbide may be used.

Figure 11A:
FIGS. 11A–11D illustrate cylindrical anode-pad arrangements in accordance with the preferred embodiment of the present invention.

FIGS. 11A–11D illustrate different cylindrical anode-pad arrangements in accordance with the preferred embodiment of the present invention. The cylindrical anode-pad arrangements described in FIGS. 11A–11D can be used in the plating chambers as described and illustrated with reference to FIGS. 8–10. First, FIG. 11A illustrates an anode assembly 300 having a cylindrical anode 310 and pad strips 320 that are attached thereto in a longitudinal direction. The cylindrical anode 310 is further connected to shafts 330 for rotating in a clockwise/counterclockwise direction.

Figure 11B:
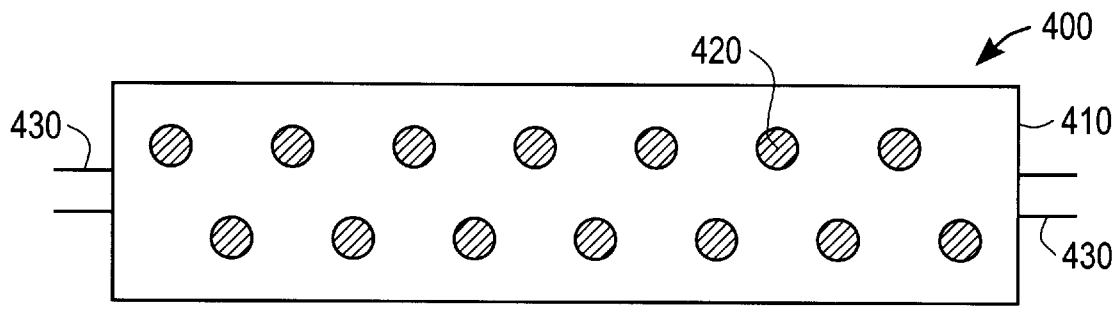

Second, FIG. 11B also illustrates an anode assembly 400 having a cylindrical anode 410 and a plurality of circular pads 420 that are attached to the cylindrical anode 410. The cylindrical anode 410 is further connected to shafts 430 for rotating in a clockwise/counterclockwise direction.

Figure 11C:
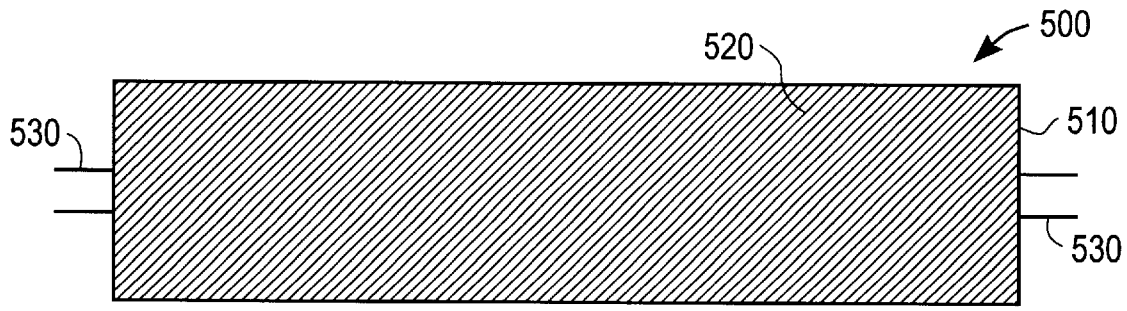

Next, FIG. 11C illustrates an anode assembly 500 having a cylindrical anode 510 and a continuous pad 520 that is attached to the cylindrical anode 510. The continuous pad covers the entire outer surface of the cylindrical anode 510. The cylindrical anode 510 is further connected to shafts 530 for rotating in a clockwise/counterclockwise direction.

Figure 11D:
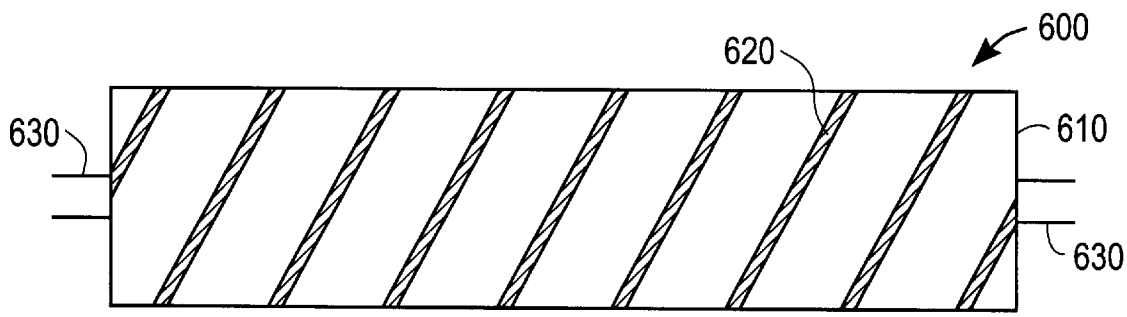

Finally, FIG. 11D illustrates an anode assembly 600 having a cylindrical anode 610 and pad strips 620 that are attached to the cylindrical anode 610 in a circular manner. The cylindrical anode 610 is further connected to shafts 630 for rotating in a clockwise/counterclockwise direction.

Each of the anode-pad arrangements of FIGS. 11A–11D allows for efficient and effective plating and cold working of the workpiece. Although only four anode-pad arrangements are described herein, the present invention can be implemented with different anode-pad arrangements and geometry so long as they can plate and cold worked the workpiece in a similar manner as described herein.

The workpieces illustrated in FIGS. 2–10 are shown in a horizontal arrangement parallel to the pad. However, the present invention can be implemented such that the workpiece/anode can be positioned in any arbitrary angle with respect to the horizontal plane. For example, the workpiece/anode may be disposed in a vertical arrangement.

The workpiece may be mechanically pulsed during the metal deposition step. The benefit of the mechanical pulsing is that it improves filling efficiency of the contact holes, vias, and trenches, and copper film integrity without the need for power supplies with pulsing capabilities. After metal deposition, the workpiece may be annealed in an inert ambient at a temperature range of 50 to 400° C. for a period of 15 seconds to 60 minutes to initiate massive grain growth.

After performing the plating and cold working steps as described above, a CMP step can be performed. CMP is a material planarization process that combines chemical removal of semiconductor layers such as insulators or metals with mechanical buffering of the substrate surface. CMP may provide global planarization of the workpiece surface. For example, during a wafer fabrication process, CMP is often used to polish the profiles that build up in multilevel metal interconnection schemes. In another embodiment of this invention, metal deposition may occur in any type of plating cell, and after such metal deposition, the workpiece may be transferred to another tool or cell, (i.e. CMP tool), where the deposited metal surface is cold worked. Hence, plating and cold worked plated metal or material may be laminated using more than one tool set, prior to subsequent processes. For instance, a first cell may be an electroless plating cell, an electroplating cell, a CVD cell, or a sputtering cell. Alternatively, a second cell may also be a plating cell.

In yet another embodiment of this invention, a different type of material maybe laminated or sandwiched between conductive layers. For example, after the deposition of a thin copper layer using the cold worked method, the workpiece may be transferred to another cell, where an insulator material or another type of metal or alloy (i.e., PERMALLOY—registered Trademark) maybe deposited over the cold worked copper layer. The surface of the deposited PERMALLOY (nickel-iron alloy) in turn may be cold worked prior to subsequent depositions or processes. Thus, a stack of materials consisting of, for example, Cu/Ni—Fe/Cu/Ni—Fe/etc., where the Cu and Ni—Fe layer may consist of at least one cold worked surface, is formed prior to subsequent processes. The material deposited over the cold worked layer does not need to be electro-deposited. In other words, the new material could be deposited by CVD, sputtering, spin coating, immersion plating, electroless plating and the like. For instance, in the case where the cold worked surface is copper, it may be coated with, for example, CoP, Au, NiP, from electroless plating bath.

Along with using copper and its alloys as the conductive material, other conductive materials such as aluminum, iron, nickel, chromium, indium, lead, tin, lead-tin alloys, non-leaded solderable alloys, silver, zinc, cadmium, titanium, tungsten, molybdenum, ruthenium, their respective alloys and various combinations of above material with oxygen, nitrogen, hydrogen and phosphorous may be used in the present invention.

Further, besides having the conducting material as metals, the present invention may be used with insulators, such as glasses, and polymeric and nonpolymeric insulators. The insulator may be spin coated, evaporate-deposited or even sputtered, and the insulator is such that its dielectric constant is preferably lower than 4 or higher than 7.

This present invention is especially suited for the fabrication of high performance and highly reliable chip interconnect, packaging, magnetic, flat panel and optoelectronic applications. Besides providing a method to control and alter the texture of the conductive layer, the present invention also provides a method of fabricating grain or crystal interconnect structures, such that adjacent (above or under) vias and holes are essentially a single grain or crystal.

In the previous descriptions, numerous specific details are set forth, such as specific materials, structures, chemicals, processes, etc., to provide a thorough understanding of the present invention. However, as one having ordinary skill in the art would recognize, the present invention can be practiced without resorting to the details specifically set forth.

Although various preferred embodiments have been described in detail above, those skilled in the art will readily appreciate that many modifications of the exemplary embodiment are possible without materially departing from the novel teachings and advantages of this invention.

We claim:

1. A method for altering the texture of a top portion of a conductive layer formed on a substrate, the method comprising the steps of:
    (1) plating the conductive layer on the substrate by applying a plating solution thereto using an anode and a pad disposed in proximity to the substrate, when the anode and the substrate are energized with electric power; and
    (2) altering the texture of the top portion of the conductive layer during a period when the pad makes contact with the top portion of the conductive layer, when the anode and the substrate are de-energized.

2. A method according to claim 1, wherein the conductive layer comprises copper.

3. A method according to claim 2, wherein the altering step further comprises the step of using the pad to make contact with the top portion of the conductive layer at a pressure ranging from 0.0001 to 5 pounds per inch for 1 to 180 seconds.

4. A method according to claim 1, wherein the anode comprises one of a cylindrical anode or a plate anode.

5. A method according to claim 4, wherein the anode is movable.

6. A method according to claim 5, wherein one of the anode and the substrate rotates in a circular manner in a range of 10 to 2000 revolutions per minute.

7. A method according to claim 1, wherein the plating step further comprises the step of plating the conductive layer on the substrate when the pad and the substrate are spaced apart from each other at a distance ranging from 1 micron to 2 millimeters.

8. A method according to claim 1, wherein the steps (1) and (2) are repeated a plurality of times.

9. A method according to claim 1, wherein the surface of the substrate comprises the surface of one of a wafer, a flat panel, a magnetic film head, or a packaging device.

10. A method according to claim 1, wherein the conductive layer comprises one of a copper, gold, aluminum, iron, nickel, chromium, indium, lead, tin, lead-tin alloys, non-leaded solderable alloys, silver, zinc, cadmium, titanium, tungsten, molybdenum, ruthenium, or combinations thereof.

11. A method according to claim 1 further comprising the step of, after altering the texture of the top portion of the conductive layer, annealing the conductive layer at a temperature between 50 to 400° C. for a period of 15 seconds to 60 minutes, thereby forming grains in the conductive layer that are between 1 to 100 microns.

12. A method according to claim 11 further comprising the step of polishing the annealed conductive layer such that a single crystal is formed in a via or trench of the substrate.

13. A method for altering the texture of a top portion of a conductive layer formed on a seed layer on a substrate, the method comprising the steps of:

(1) plating the conductive layer on the seed layer by applying a plating solution thereto, when an anode and the substrate are energized with electric power; and (2) altering the texture of the top portion of the conductive layer during a period when a pad makes contact with the top portion of the conductive layer, when the anode and the substrate are de-energized.

14. A method according to claim 13, wherein the conductive layer and the seed layer comprises copper.

15. A method according to claim 13, wherein the altering step further comprises the step of using the pad to make contact with the top portion of the conductive layer at a pressure ranging from 0.0001 to 5 pounds per inch.

16. A method according to claim 13, wherein the altering step further comprises the step of using the pad to make contact with the top portion of the conductive layer for 1 to 180 seconds.

17. A method according to claim 13, wherein the plating step further comprises the step of plating the conductive layer on the seed layer when the pad and the substrate are spaced apart from each other at a distance ranging from 1 micron to 2 millimeters.

18. A method according to claim 13, wherein the steps (1) and (2) are repeated a plurality of times.

19. A method according to claim 13, further comprising the step of, after altering the texture of the top portion of the conductive layer, annealing the conductive layer, thereby forming grains in the conductive layer that are between 1 to 100 microns.

20. A method for altering the texture of a top portion of a conductive layer formed on a substrate, the method comprising the steps of:

(1) plating the conductive layer on the substrate by applying a plating solution thereto using an anode and a pad disposed in proximity to the substrate, when the anode and the substrate are energized with electric power; and (2) altering the texture of the top portion of the conductive layer during a period when the pad makes contact with the top portion of the conductive layer by transforming the size or shape of certain grains in the conductive layer.

21. A method according to claim 20, wherein the conductive layer comprises copper.

22. A method according to claim 20, wherein the altering step further comprises de-energizing the anode and the substrate when the pad makes contact with the top portion of the conductive layer.

23. A method according to claim 22, wherein the altering step further comprises the step of using the pad to make contact with the top portion of the conductive layer at a pressure ranging from 0.0001 to 5 pounds per inch.

24. A method according to claim 22, wherein the altering step further comprises the step of using the pad to make contact with the top portion of the conductive layer for 1 to 180 seconds.

25. A method according to claim 20, wherein the anode comprises one of a cylindrical anode or a plate anode.

26. A method according to claim 25, wherein the anode is movable.

27. A method according to claim 26, wherein one of the anode and the substrate rotates in a circular manner in a range of 10 to 2000 revolutions per minute.

28. A method according to claim 20, wherein the surface of the substrate comprises the surface of one of a wafer, a flat panel, a magnetic film head, or a packaging device.

29. A method according to claim 20 further comprising the step of, after altering the texture of the top portion of the conductive layer, annealing the conductive layer at a temperature between 50 to 400° C. for a period of 15 seconds to 60 minutes, thereby forming grains in the conductive layer that are between 1 to 100 microns.

30. A method according to claim 29 further comprising the step of polishing the annealed conductive layer such that a single crystal is formed in a via or trench of the substrate.

* * * * *